(12) United States Patent
Saito

(10) Patent No.: US 10,979,035 B2
(45) Date of Patent: Apr. 13, 2021

(54) SCHMITT TRIGGER INVERTER CIRCUIT

(71) Applicant: FUJI ELECTRIC CO., LTD., Kawasaki (JP)

(72) Inventor: Isao Saito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/203,240

(22) Filed: Nov. 28, 2018

(65) Prior Publication Data

US 2019/0229714 A1 Jul. 25, 2019

(30) Foreign Application Priority Data

Jan. 19, 2018 (JP) ................. 2018-007074

(51) Int. Cl.
*H03K 3/3565* (2006.01)
*H03K 17/22* (2006.01)
*H03K 3/011* (2006.01)
*H03K 3/012* (2006.01)

(52) U.S. Cl.
CPC ........... *H03K 3/3565* (2013.01); *H03K 3/011* (2013.01); *H03K 3/012* (2013.01); *H03K 17/223* (2013.01)

(58) Field of Classification Search
CPC ........ H03K 17/00; H03K 17/223; H03K 3/00; H03K 3/011; H03K 3/013; H03K 3/02337; H03K 3/0377; H03K 3/3565; H03K 5/00; H03K 5/2481
USPC ......................................................... 327/206
See application file for complete search history.

(56) References Cited

U.S. PATENT DOCUMENTS

| | | | | |
|---|---|---|---|---|
| 5,654,645 A | * | 8/1997 | Lotfi | H03K 3/3565 326/24 |
| 6,060,925 A | * | 5/2000 | Chou | H03K 3/3565 327/205 |
| 6,448,830 B1 | * | 9/2002 | Chuang | H03K 3/3565 327/205 |
| 2012/0081349 A1 | * | 4/2012 | Tomita | G09G 3/20 345/211 |

FOREIGN PATENT DOCUMENTS

JP 6182532 A 4/1986
JP 10163826 A 6/1998

* cited by examiner

*Primary Examiner* — Lincoln D Donovan
*Assistant Examiner* — Dave Mattison

(57) ABSTRACT

To suppress the generation of a shoot-through current in a Schmitt trigger inverter circuit, a Schmitt trigger inverter circuit SINVa includes: a CMOS inverter CI having the input and output connected to the input and output of the Schmitt trigger inverter circuit, respectively; a first transistor MN3 having the gate connected to the output of the CMOS inverter; and a first current limiting element DEP1 connected to the first transistor in series.

40 Claims, 6 Drawing Sheets

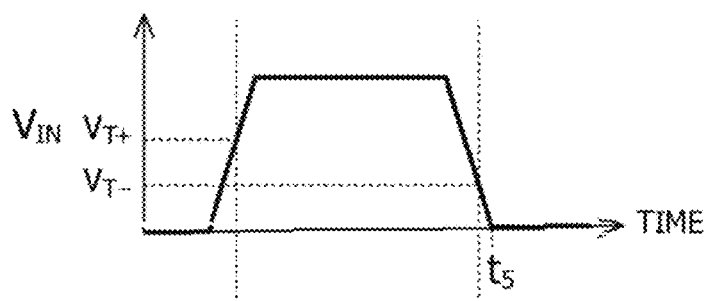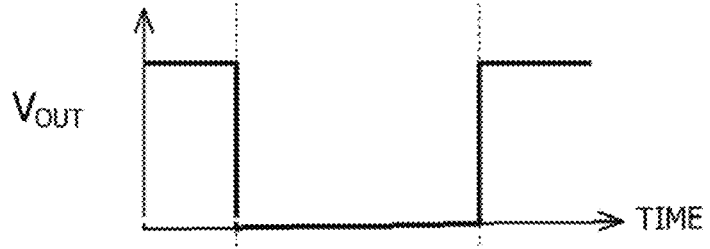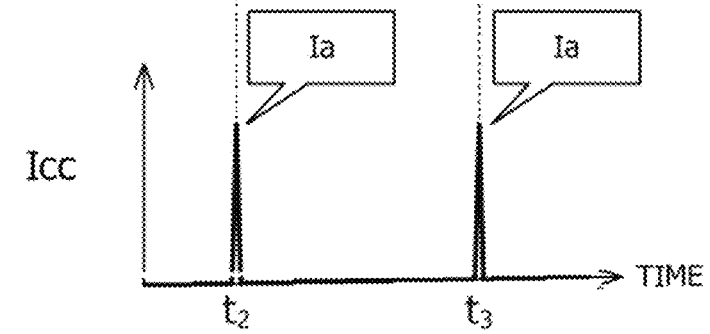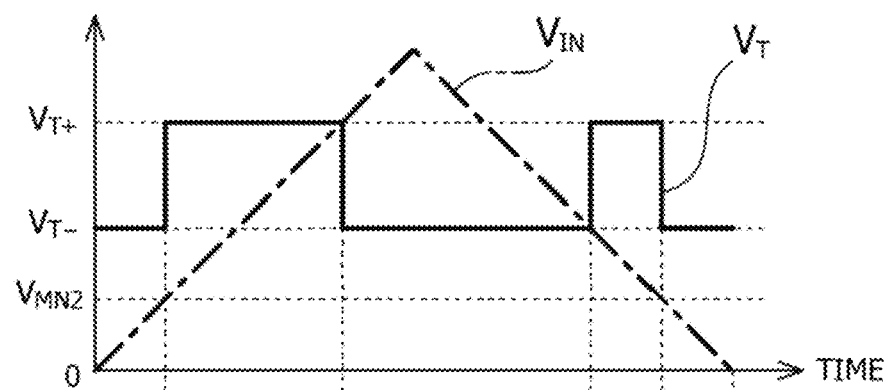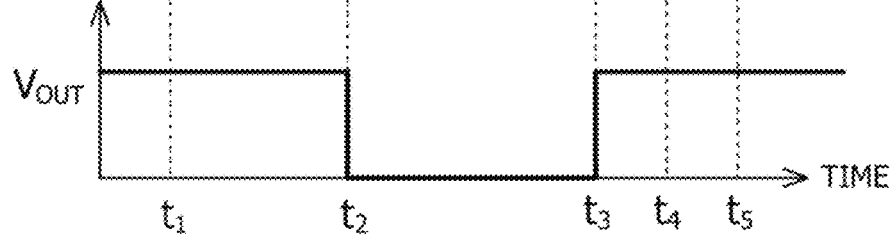

US 10,979,035 B2

SCHMITT TRIGGER INVERTER CIRCUIT

CROSS-REFERENCE TO RELATED APPLICATIONS

This application claims benefit of Japanese Patent Application No. 2018-007074, filed in Japan on Jan. 19, 2018 the disclosure of which is hereby incorporated by reference.

BACKGROUND OF THE INVENTION

Field of the Invention

The present disclosure relates to a Schmitt trigger inverter circuit.

Description of Related Art

An exemplary Schmitt trigger inverter circuit is described in Patent Literature 1.

FIG. 6 illustrates a Schmitt trigger inverter circuit SINV as another example. This Schmitt trigger inverter circuit includes an input terminal IN, an output terminal OUT, a power supply terminal VCC into which a power supply voltage is externally input, and a ground terminal GND connected to a ground level. The Schmitt trigger inverter circuit SINV further includes a transistor MP1, which is a P-channel MOSFET, and transistors MN1, MN2, and MN3, which are N-channel MOSFETs.

The transistor MP1 has its source connected to the power supply terminal VCC and has its gate connected to the input terminal IN. The transistor MN1 has its drain connected to the drain of the transistor MP1 and has its gate connected to the input terminal IN. The node between the drain of the transistor MP1 and the drain of the transistor MN1 is connected to the output terminal OUT. In other words, the transistors MP1 and MN1 form a CMOS inverter CI. The input of the CMOS inverter CI (the node between the gate of the transistor MP1 and the gate of the transistor MN1) is connected to the input terminal IN, and the output of the CMOS inverter CI (the node between the drain of the transistor MP1 and the drain of the transistor MN1) is connected to the output terminal OUT.

The transistor MN2 has its drain connected to the source of the transistor MN1 in the CMOS inverter CI, has its source connected to the ground terminal GND, and has its gate connected to the input terminal IN.

The transistor MN3 has its drain connected to the power supply terminal VCC, has its source connected to the node between the source of the transistor MN1 and the drain of the transistor MN2, and has its gate connected to the output of the CMOS inverter CI.

In the Schmitt trigger inverter circuit SINV, while the transistor MN3 is on, a force pulling a potential $V_{OUT}$ at the output terminal OUT toward the power supply voltage VCC is strong. Then, in order to shift the potential $V_{OUT}$ from a high level to a low level, it is necessary to further raise the gate voltages of the transistors MN1 and MN2 to further lower the on-resistances of both transistors. Specifically, with a first threshold $V_{T+}$ and a second threshold $V_{T-}$ as two thresholds of the Schmitt trigger inverter circuit SINV ($V_{T+} > V_{T-}$), a threshold $V_T$ for this Schmitt trigger inverter circuit is the first threshold $V_{T+}$ while the transistor MN3 is on, and is the second threshold $V_{T-}$ while the transistor is off.

When the gate voltage of the transistor MN3 is at a low level (equal to the potential at the ground terminal GND), the transistor is off. However, when the gate voltage of the transistor MN3 (the voltage $V_{OUT}$ at the output terminal OUT) is at a high level (equal to the potential at the power supply terminal VCC), the state of the transistor is dependent on the state of the transistor MN2 as described below.

The transistor MN3 is turned on when the gate voltage of the transistor MN3 shifts to the high level while the transistor MN2 is on, thereby connecting the source of the transistor MN3 to the ground terminal GND. On the other hand, even with the gate voltage of the transistor MN3 being at the high level, the transistor MN3 is disconnected from the ground terminal GND when the transistor MN2 is switched off, so that the current flowing into the transistor MN3 from the power supply terminal VCC instantly charges a parasitic capacitor accompanying the source terminal of the transistor. By this charge, the voltage at the source terminal of the transistor MN3 abruptly rises, and the transistor is turned off when the gate-source voltage of the transistor becomes lower than or equal to a gate threshold. Thus, once the transistor MN2 is turned off, the transistor MN3 is turned off (after the period where the above instantaneous charge occurs) even if the gate voltage of the transistor is at the high level.

FIG. 7(a) illustrates time-series changes in a voltage $V_{IN}$ at the input terminal IN, and FIG. 7(b) illustrates time-series changes in the voltage $V_{OUT}$ at the output terminal OUT. Furthermore, FIG. 8(a) illustrates the time-series changes in the voltage $V_{IN}$ at the input terminal IN and the threshold voltage $V_T$ of the Schmitt trigger inverter circuit SINV, and FIG. 8(b) illustrates the time-series changes in the voltage $V_{OUT}$ at the output terminal OUT. Note that a gate threshold $V_{NM2}$ of the transistor MN2 is lower than the second threshold $V_{T-}$ of the Schmitt trigger inverter circuit SINV.

From a time 0 to a time $t_1$, the voltage $V_{IN}$, rising with time, is lower than the gate threshold $V_{MN2}$ of the transistor MN2, and the transistor MN2 is therefore in an off state. Accordingly, the transistor MN3 is also in an off state, as described above. Thus, the threshold $V_T$ of the Schmitt trigger inverter circuit SINV is the second threshold $V_{T-}$. Since the voltage $V_{IN}$ is lower than this second threshold $V_{T-}$, the voltage $V_{OUT}$ at the output terminal OUT is at the high level. Meanwhile, the transistor MP1 is in an on state.

From the time $t_1$ to a time $t_2$, the voltage $V_{IN}$, rising with time, is higher than the threshold $V_{MN2}$ of the transistor MN2, and the transistor MN2 is therefore in an on state, so that the source of the transistor MN3 is connected to the ground terminal GND. At the same time, the transistor MP1 is still in the on state. For this reason, the gate voltage of the transistor MN3 is at the high level, and the transistor is therefore in an on state. Thus, the threshold $V_T$ of the Schmitt trigger inverter circuit SINV is the first threshold $V_{T+}$. Since the voltage $V_{IN}$ is lower than this first threshold $V_{T+}$, the voltage $V_{OUT}$ at the output terminal OUT remains at the high level.

From the time $t_2$ to a time $t_3$, the voltage $V_{IN}$ rises with time and drops with time after reaching the maximum value. Since the transistor MP1 is in an off state and the gate voltage of the transistor MN3 is therefore at the low level, the transistor MN3 is in the off state. Thus, the threshold $V_T$ of the Schmitt trigger inverter circuit is the second threshold $V_{T-}$. Since the voltage $V_{IN}$ is higher than this second threshold $V_{T-}$, the voltage $V_{OUT}$ at the output terminal OUT is at the low level.

From the time $t_3$ to a time $t_4$, the voltage $V_{IN}$, dropping with time, is higher than the threshold $V_{MN2}$ of the transistor MN2, and the transistor MN2 is therefore in the on state, so that the source of the transistor MN3 remains connected to the ground terminal GND. On the other hand, the transistor MP1 is in the on state. For this reason, the gate voltage of the transistor MN3 is at the high level, and the transistor is therefore in the on state. Thus, the threshold $V_T$ of the Schmitt trigger inverter circuit SINV is the first threshold $V_{T+}$. Since the voltage $V_{IN}$ is lower than this first threshold $V_{T+}$, the voltage $V_{OUT}$ at the output terminal OUT is at the high level.

From the time $t_4$ to a time $t_5$, the voltage $V_{IN}$, dropping with time, is lower than the threshold $V_{MN2}$ of the transistor MN2, and the transistor MN2 is therefore in the off state. Accordingly, the transistor MN3 is also in the off state, as described above. Thus, the threshold of the Schmitt trigger inverter circuit SINV is the second threshold $V_{T-}$. Since the voltage $V_{IN}$ is lower than this second threshold $V_{T-}$, the voltage $V_{OUT}$ at the output terminal OUT is still at the high level.

FIG. 7(c) illustrates time-series changes in a current ICC flowing from the power supply terminal VCC through the transistors MN3 and MN2 to the ground terminal GND. Just around the time $t_2$, at which the voltage $V_{IN}$ switches from the low level to the high level, the transistors MN2 and MN3 are both in the on state, and a shoot-through current Ia flows from the power supply terminal VCC through both transistors to the ground terminal GND. The shoot-through current Ia flows similarly just around the time $t_3$, at which the voltage $V_{IN}$ switches from the high level to the low level. The current ICC is zero except for the periods around the times $t_2$ and $t_3$, at which the voltage $V_{IN}$ switches from one of the high level and the low level to the other.

FIG. 9 illustrates a power supply voltage detection circuit VDC that detects a power supply voltage from an automobile battery or the like and the Schmitt trigger inverter circuit SINV connected to this power supply voltage detection circuit. Note that reference symbol VCC in FIG. 9 denotes the power supply voltage.

The power supply voltage detection circuit VDC includes transistors DEP51 and DEP52, which are depletion-mode N-channel MOSFETs, and Zener diodes ZD1 to ZD3. The transistors DEP51 and DEP52 have the same properties. The drain of the transistor DEP51 is connected to the power supply terminal VCC, and the source of the transistor is connected to the drain of the transistor DEP 52. The source of the transistor DEP52 is connected to the ground level GND, for example, through the three Zener diodes ZD1 to ZD3, which are connected in series so as to be reverse biased relative to the power supply voltage. The gates of the transistors DEP51 and DEP52 are connected to their respective sources.

The node between the source of the transistor DEP51 and the drain of the transistor DEP52 is the output of the power supply voltage detection circuit VDC. This output is input into the Schmitt trigger inverter circuit SINV, which is connected to the power supply voltage VCC and the internal ground GND.

FIG. 10 illustrates the operation of the Schmitt trigger inverter circuit SINV connected to the power supply voltage detection circuit VDC. FIG. 10(a) illustrates the relationship between the power supply voltage VCC and the current ICC, and FIG. 10(b) illustrates the relationship between the power supply voltage VCC and the voltage $V_{OUT}$ at the output terminal OUT. While the power supply voltage VCC is lower than the breakdown voltage of the Zener diodes ZD1 to ZD3, blocking is performed by the Zener diodes. Thus, the voltage $V_{IN}$ and the source potential of the transistor DEP52 are equal to the power supply voltage VCC, so that the voltage $V_{OUT}$ is at the low level. When the power supply voltage VCC reaches or exceeds the breakdown voltage of the three Zener diodes, the source potential of the transistor DEP52 is clamped at the breakdown voltage of the Zener diodes ZD1 to ZD3. Thus, the voltage $V_{IN}$ is an intermediate voltage between the power supply voltage VCC and the breakdown voltage of the three Zener diodes, and the higher the power supply voltage VCC, the greater the difference between the power supply voltage VCC and the voltage $V_{IN}$. When the power supply voltage VCC is a voltage near the breakdown voltage of the three Zener diodes, the voltage $V_{OUT}$ remains at the low level. However, as the power supply voltage VCC increases further, the voltage $V_{IN}$ becomes lower than the threshold voltage of the Schmitt trigger inverter circuit SINV, so that the voltage $V_{OUT}$ shifts to the high level. It can be understood that the shoot-through voltage Ia flows when the voltage $V_{OUT}$ switches from the low level to the high level.

Patent Literature

Patent Literature 1: Japanese Patent Application Publication No. S61-82532

SUMMARY OF THE INVENTION

Considering the growing trend for lower consumption of current in recent years, the unnecessary consumption of current caused by the above shoot-through voltage is problematic. In view of the above conventional technique, an object of the present disclosure is to suppress the generation of a shoot-through voltage in a Schmitt trigger inverter circuit.

To achieve the above object, a Schmitt trigger inverter circuit according to the present disclosure includes: a CMOS inverter having an input and output connected to an input and output of the Schmitt trigger inverter circuit, respectively; a first transistor having a gate connected to the output of the CMOS inverter; and a first current limiting element connected to the first transistor in series.

According to one aspect, the Schmitt trigger inverter circuit may further include a second transistor having a gate connected to the input of the Schmitt trigger inverter circuit, a drain connected to a source of an N-channel transistor in the CMOS inverter, and a source connected to a reference potential of the Schmitt trigger inverter circuit. The series circuit of the first transistor and the first current limiting element is connected between a power supply terminal of the Schmitt trigger inverter circuit and a node between the source of the N-channel transistor in the CMOS inverter and the drain of the second transistor.

The first current limiting element can be a resistor or a current source circuit.

The first current limiting element can be a depletion-mode transistor with a gate and source connected to each other.

The Schmitt trigger inverter circuit may further include: a third transistor having a gate connected the output of the CMOS inverter; a second current limiting element connected to the third transistor in series; and a fourth transistor having a gate connected to the input of the Schmitt trigger inverter circuit, a source connected to the power supply terminal of the Schmitt trigger inverter circuit, and a drain connected to a source of a P-channel transistor in the CMOS inverter and a source of the third transistor. The series circuit of the third transistor and the second current limiting element is connected between the reference potential of the Schmitt trigger inverter circuit and a node between the source of the P-channel transistor in the CMOS inverter and the drain of the fourth transistor.

The second current limiting element can be a resistor or a current source circuit.

The second current limiting element can be a depletion-mode transistor with a gate and source connected to each other.

According to another aspect, the Schmitt trigger inverter circuit may further include a second transistor having a gate connected to the input of the Schmitt trigger inverter circuit, a source connected to a power supply terminal of the Schmitt trigger inverter circuit, and a drain connected to a source of a P-channel transistor in the CMOS inverter. The series circuit of the first transistor and the first current limiting element is connected between a reference potential of the Schmitt trigger inverter circuit and a node between the source of the P-channel transistor in the CMOS inverter and the drain of the second transistor.

The first current limiting element can be a resistor or a current source circuit.

The first current limiting element can be a depletion-mode transistor with a gate and source connected to each other.

According to the present disclosure, it is possible to suppress the generation of a shoot-through voltage in a Schmitt trigger inverter circuit.

BRIEF DESCRIPTION OF THE DRAWINGS

FIGS. 7(a), 7(b), and 7(c) show timing charts illustrating the operation of the conventional Schmitt trigger inverter circuit.

FIGS. 8(a) and 8(b) show another set of timing charts illustrating the operation of the conventional Schmitt trigger inverter circuit.

DESCRIPTION OF PREFERRED EMBODIMENTS

Embodiments of the present disclosure will now be described. However, the present disclosure is not limited by the following embodiments.

First Embodiment

Figure 1:
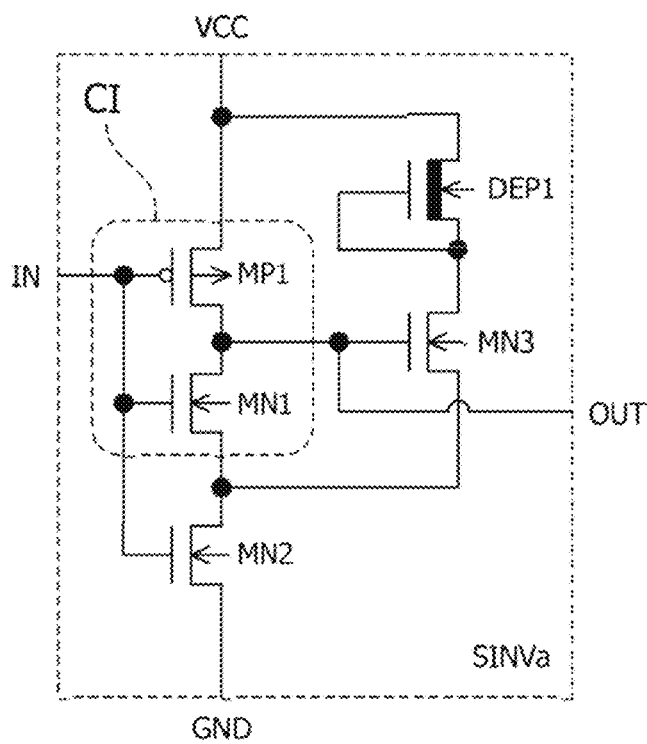
FIG. 1 is an explanatory diagram of a Schmitt trigger inverter circuit according to a first embodiment of the present disclosure.

FIG. 1 illustrates a Schmitt trigger inverter circuit SINVa according to a first embodiment of the present disclosure.

Figure 6:
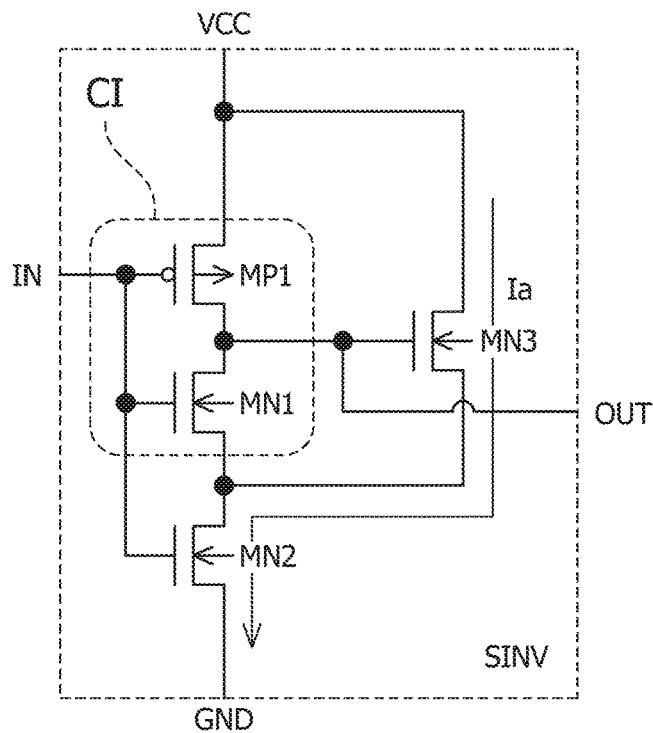
FIG. 6 is an explanatory diagram of a conventional Schmitt trigger inverter circuit.

The same elements as those in FIG. 6 are denoted by the same reference symbols, and their specific description will be omitted. The Schmitt trigger inverter circuit SINVa includes a transistor DEP1, which is a depletion-mode N-channel MOSFET, in addition to the configuration in FIG. 6. The transistor DEP1 has its drain connected to the power supply terminal VCC, has its source connected to the drain of the transistor MN3, and has its gate connected to its source. Note that each of the transistors MP1 and MN1 to MN3 is an enhancement-mode transistor.

Figure 2A:
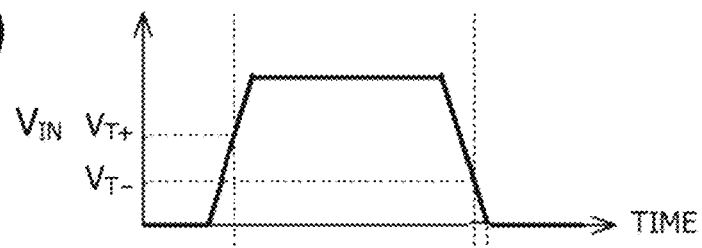
FIGS. 2(a), 2(b), and 2(c) show timing charts illustrating the operation of the Schmitt trigger inverter circuit according to the first embodiment of the present disclosure.
Figure 2B:
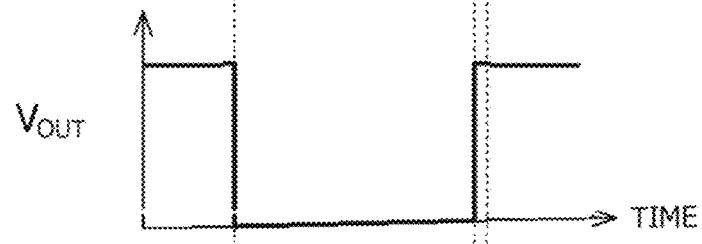
Figure 2C:
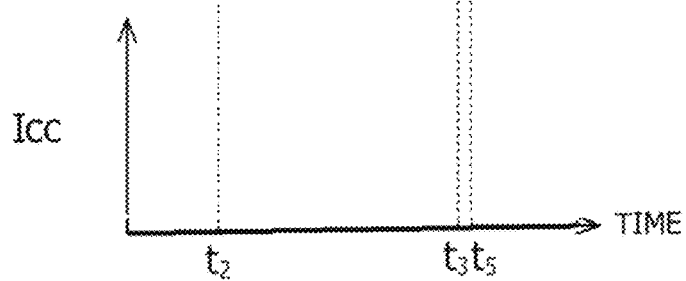

FIG. 2(a) illustrates time-series changes in the voltage $V_{IN}$ at the input terminal IN of the Schmitt trigger inverter circuit SINVa. FIG. 2(b) illustrates time-series changes in the voltage $V_{OUT}$ at the output terminal OUT of the Schmitt trigger inverter circuit. FIG. 2(c) illustrates time-series changes in the current ICC.

Figure 3A:
FIGS. 3(a) and 3(b) show timing charts illustrating the operation of the Schmitt trigger inverter circuit according to the first embodiment of the present disclosure connected to a power supply voltage detection circuit.
Figure 3B:
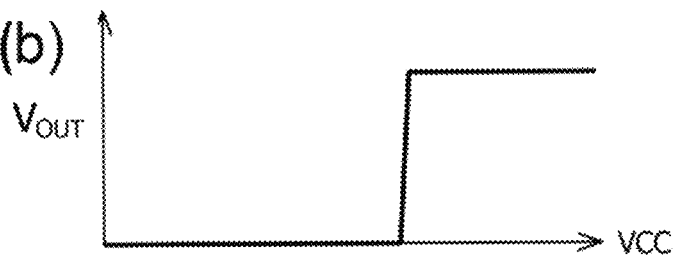
Figure 9:
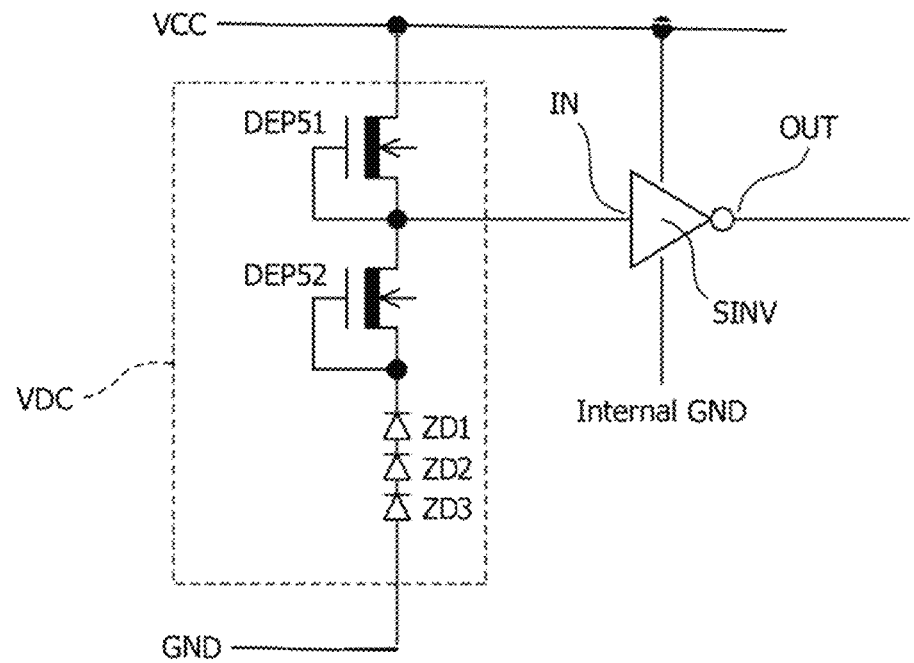
FIG. 9 is an explanatory diagram of the conventional Schmitt trigger inverter circuit connected to a power supply voltage detection circuit.
Figure 10A:
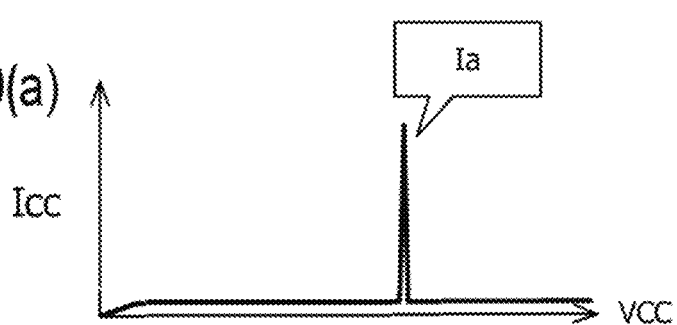
FIGS. 10(a) and 10(b) show timing charts illustrating the operation of the conventional Schmitt trigger inverter circuit connected to the power supply voltage detection circuit.
Figure 10B:
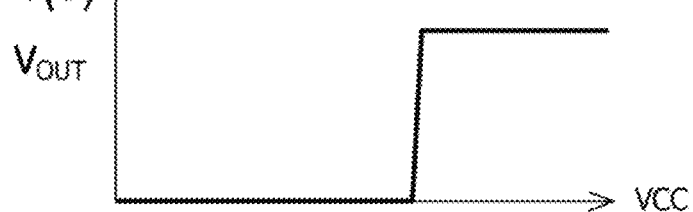

FIGS. 3(a) and 3(b) illustrate the operation of the Schmitt trigger inverter circuit SINVa in the case in which the Schmitt trigger inverter circuit is used in combination with the power supply voltage detection circuit VDC, illustrated in FIG. 9. FIG. 3(a) illustrates the relationship between the power supply voltage VCC and the current ICC, and FIG. 3(b) illustrates the relationship between the power supply voltage VCC and the voltage $V_{OUT}$ at the output terminal OUT.

In the Schmitt trigger inverter circuit SINVa, the transistor DEP1 is a kind of constant current source and serves as a current limiting element. Specifically, the current flowing from the power supply terminal VCC through the transistors MN3 and MN2 to the ground terminal GND is limited to be lower than or equal to the drain-source current of the transistor DEP1 in a state in which its gate-source voltage is zero. In this way, as illustrated in FIGS. 2 and 3, it is possible to suppress the generation of the shoot-through current Ia at the times at which the input voltage $V_{IN}$ switches.

Second Embodiment

Figure 4:
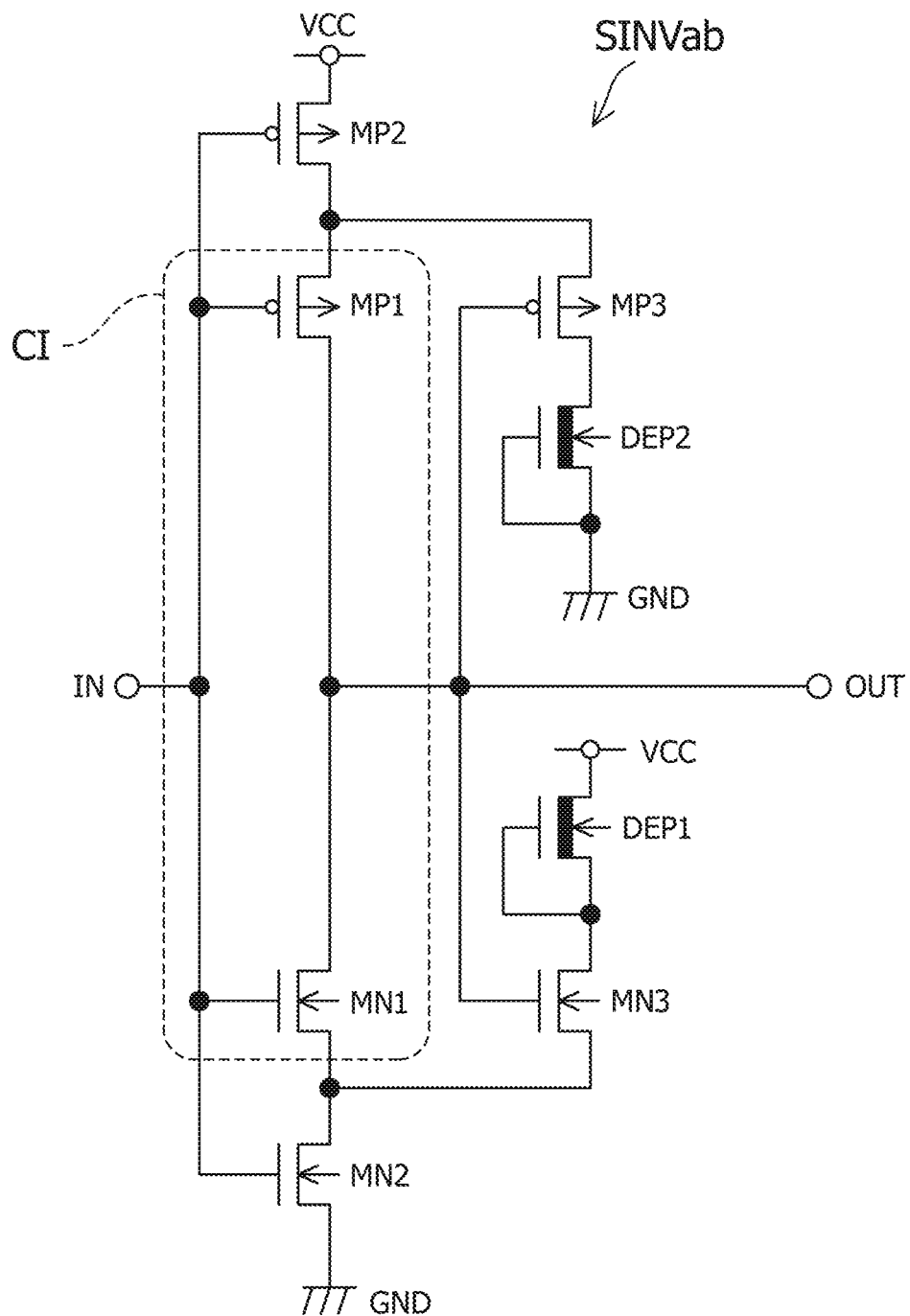
FIG. 4 is an explanatory diagram of a Schmitt trigger inverter circuit according to a second embodiment of the present disclosure.

FIG. 4 illustrates a Schmitt trigger inverter circuit SINVab according to a second embodiment of the present disclosure. The same elements as those in FIG. 1 are denoted by the same reference symbols, and their specific descriptions will be omitted. The Schmitt trigger inverter circuit SINVab includes transistors MP2 and MP3, which are enhancement-mode P-channel MOSFETs, and a transistor DEP2, which is a depletion-mode N-channel MOSFET, in addition to the configuration of the Schmitt trigger inverter circuit in FIG. 1.

The transistor MP2 has its source connected to the power supply terminal VCC, has its drain connected to the source of the transistor MP1 in the CMOS inverter CI, and has its gate connected to the input terminal IN. The transistor MP3 has its source connected to the node between the source of the transistor MP1 and the drain of the transistor MP2, and has its gate connected to the output of the CMOS inverter CI. The transistor DEP2 has its drain connected to the drain of the transistor MP3, has its source connected to the ground terminal GND, and has its gate connected to its source.

With the Schmitt trigger inverter circuit SINVab, the hysteresis voltage (the difference between the first threshold $V_{T+}$ and the second threshold $V_{T-}$) can be higher than that of the Schmitt trigger inverter circuit SINVa in FIG. 1. At the same time, the transistor DEP2 is a kind of constant current source and serves as a current limiting element. Specifically, the current flowing from the power supply terminal VCC through the transistors MP2 and MP3 to the ground terminal GND is limited to be lower than or equal to the drain-source current of the transistor DEP2 in state in which its gate-source voltage is zero. In this way, it is possible to suppress the generation of a shoot-through current flowing from the power supply terminal VCC through the transistors MP2 and MP3 to the ground terminal GND. The transistor DEP1 suppresses the generation of a shoot-through current flowing from the power supply terminal VCC through the transistors MN3 and MN2 to the ground terminal GND, as mentioned earlier. Note that this embodiment is equivalent to a circuit with a countermeasure against the shoot-through current in the Schmitt trigger inverter circuit illustrated in FIG. 1 of Patent Literature 1.

Third Embodiment

Figure 5:
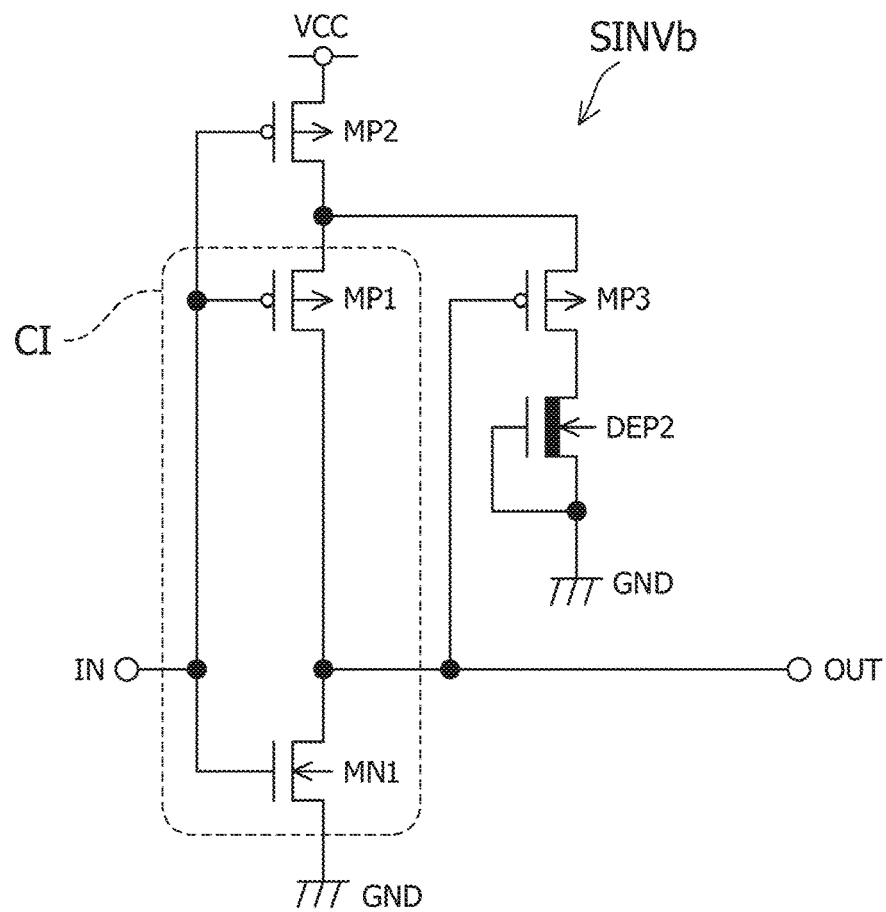
FIG. 5 is an explanatory diagram of a Schmitt trigger inverter circuit according to a third embodiment of the present disclosure.

FIG. 5 illustrates a Schmitt trigger inverter circuit SINVb according to a third embodiment of the present disclosure. The same elements as those in FIG. 4 are denoted by the same reference symbols, and their specific descriptions will be omitted. The Schmitt trigger inverter circuit SINVb includes the CMOS inverter CI and the transistors MP2, MP3, and DEP2 but does not include any of the transistors MN2, MN3, and DEP1, unlike the Schmitt trigger inverter circuit SINVab in FIG. 4.

With the Schmitt trigger inverter circuit SINVb too, it is possible to suppress the generation of the shoot-through current flowing from the power supply terminal VCC through the transistors MP2 and MP3 to the ground terminal GND.

In any of the first to third embodiments, the generation of a shoot-through current(s) can be suppressed. Accordingly, the consumption of the power supply current can be reduced.

The transistor DEP1 (FIGS. 1 and 4) and the transistor DEP2 (FIGS. 4 and 5), which are current source circuits, can be replaced with resistors. Thus, current source circuits or resistors can be used as the current limiting elements in the embodiments of the present disclosure.

Also, the order in which the transistor DEP1 and the transistor MN3 are connected may be reversed, as long as a series circuit of the transistor MN3 and the transistor DEP1 is connected between the power supply terminal VCC of the Schmitt trigger inverter circuit and the node between the source of the N-channel transistor MN1 in the CMOS inverter CI and the drain of the transistor MN2.

The order in which the transistor DEP2 and the transistor MP3 are connected can also be reversed, as long as a series circuit of the transistor MP3 and the transistor DEP2 is connected between the reference potential of the Schmitt trigger inverter circuit and the node between the source of the P-channel transistor MP1 in the CMOS inverter and the drain of the transistor MP2.

Furthermore, the depletion-mode transistors DEP1 and DEP2 may each be a depletion-mode P-channel MOSFET with its gate and source connected to each other.

The reference potential of the Schmitt trigger inverter circuit is not limited to the ground but can be determined as desired. Also, to distinguish the plurality of transistors, each transistor can be referred to as the n-th transistor, where n is a natural number.

Although certain embodiments of the present disclosure have been described, the present disclosure is not limited to such embodiments. Various changes based on the technical idea of the present disclosure are encompassed in the concept of the present disclosure.

LIST OF REFERENCE SYMBOLS

SINV Schmitt trigger inverter circuit
IN input terminal
OUT output terminal
VCC power supply terminal or power supply voltage
GND ground terminal or ground level
CI CMOS inverter
MP1 P-channel transistor
MN1 to MN3 N-channel transistors
SINVa Schmitt trigger inverter circuit
DEP1 depletion-mode transistor
SINVab Schmitt trigger inverter circuit
MP2 and MP3 P-channel transistors
DEP2 depletion-mode transistor
SINVb Schmitt trigger inverter circuit

What is claimed is:

1. A Schmitt trigger inverter circuit, comprising:
a CMOS inverter having an input and output connected to an input and output of the Schmitt trigger inverter circuit, respectively;
a first transistor having a gate connected to the output of the CMOS inverter;
a first current limiting element connected to the first transistor in series, the first current limiting element having a drain connected to a power supply terminal of the Schmitt trigger inverter circuit and a source connected to a drain of the first transistor; and
a second transistor having a gate connected to the input of the Schmitt trigger inverter circuit, a drain connected to a source of an N-channel transistor in the CMOS inverter, and a source connected to a reference potential of the Schmitt trigger inverter circuit,
wherein
a first series circuit of the first transistor and the first current limiting element are connected between the power supply terminal of the Schmitt trigger inverter circuit and a first node between the source of the N-channel transistor in the CMOS inverter and the drain of the second transistor,
the first current limiting element is a depletion-mode transistor with a gate and the source connected to each other,
each of the first transistor, the second transistor, and the depletion-mode transistor is an N-channel transistor,
the drain of the depletion-mode transistor is connected to the power supply terminal,
the gate and the source of the depletion-mode transistor are connected to the drain of the first transistor, and
the source of the first transistor is connected to the drain of the second transistor.

2. The Schmitt trigger inverter circuit according to claim 1, further comprising:
a third transistor having a gate connected to the output of the CMOS inverter;
a second current limiting element connected to the third transistor in series; and
a fourth transistor having a gate connected to the input of the Schmitt trigger inverter circuit, a source connected to the power supply terminal of the Schmitt trigger inverter circuit, and a drain connected to a source of a P-channel transistor in the CMOS inverter,
wherein a second series circuit of the third transistor and the second current limiting element are connected between the reference potential of the Schmitt trigger inverter circuit and a second node between the source of the P-channel transistor in the CMOS inverter and the drain of the fourth transistor.

3. The Schmitt trigger inverter circuit according to claim 2, wherein the second current limiting element is a depletion-mode transistor with a gate and a source connected to each other,
the second current limiting element is an N-channel transistor, and
the third transistor is a P-channel transistor.

4. The Schmitt trigger inverter circuit according to claim 3, wherein
the source and the gate of the second current limiting element are connected to the reference potential,
a drain of the second current limiting element is connected to a drain of the third transistor, and
a source of the third transistor is connected to the second node.

5. The Schmitt trigger inverter circuit according to claim 3, wherein
the source and the gate of the second current limiting element are connected to a source of the third transistor,
a drain of the second current limiting element is connected to the second node, and
a drain of the third transistor is connected to the reference potential.

6. A Schmitt trigger inverter circuit, comprising:
a CMOS inverter having an input and output connected to an input and output of the Schmitt trigger inverter circuit, respectively;
a first transistor having a gate connected to the output of the CMOS inverter;
a first current limiting element connected to the first transistor in series, the first current limiting element having a source connected to a reference potential of the Schmitt trigger inverter circuit and a drain connected to a drain of the first transistor; and
a second transistor having a gate connected to the input of the Schmitt trigger inverter circuit, a source connected to a power supply terminal of the Schmitt trigger inverter circuit, and a drain connected to a source of a P-channel transistor in the CMOS inverter,
wherein
the first current limiting element is a depletion-mode transistor with a gate and the source connected to each other,
a first series circuit of the first transistor and the first current limiting element are connected between a reference potential of the Schmitt trigger inverter circuit and a first node between the source of the P-channel transistor in the CMOS inverter and the drain of the second transistor,
each of the first transistor and the second transistor is a P-channel transistor,
the depletion-mode transistor is an N-channel transistor,
the gate and the source of the depletion-mode transistor are connected to the reference potential of the Schmitt trigger inverter, and
the source of the first transistor is connected to the drain of the second transistor.

7. The Schmitt trigger inverter circuit according to claim 6, further comprising:
a third transistor having a gate connected to the output of the CMOS inverter;
a second current limiting element connected to the third transistor in series; and
a fourth transistor having a gate connected to the input of the Schmitt trigger inverter circuit, a source connected to the reference potential of the Schmitt trigger inverter circuit, and a drain connected to a source of a N-channel transistor in the CMOS inverter,
wherein a second series circuit of the third transistor and the second current limiting element are connected between the power supply terminal of the Schmitt trigger inverter circuit and a second node between the source of the N-channel transistor in the CMOS inverter and the drain of the fourth transistor.

8. The Schmitt trigger inverter circuit according to claim 7, wherein
the second current limiting element is a depletion-mode transistor with a gate and a source connected to each other,
the second current limiting element is an N-channel transistor, and
the third transistor is a N-channel transistor.

9. The Schmitt trigger inverter circuit according to claim 8, wherein
a drain of the second current limiting element is connected to the power supply terminal,
the source and the gate of the second current limiting element are connected to a drain of the third transistor, and
a source of the third transistor is connected to the second node.

10. The Schmitt trigger inverter circuit according to claim 8, wherein
a drain of the second current limiting element is connected to a source of the third transistor,
the source and the gate of the second current limiting element are connected to the second node, and
a drain of the third transistor is connected to the power supply terminal.

11. A Schmitt trigger inverter circuit, comprising:
a CMOS inverter having an input and output connected to an input and output of the Schmitt trigger inverter circuit, respectively;
a first transistor having a gate connected to the output of the CMOS inverter;
a first current limiting element connected to the first transistor in series, the first current limiting element having a drain connected to a source of the first transistor; and
a second transistor having a gate connected to the input of the Schmitt trigger inverter circuit, a drain connected to a source of an N-channel transistor in the CMOS inverter, and a source connected to a reference potential of the Schmitt trigger inverter circuit,
wherein
a first series circuit of the first transistor and the first current limiting element are connected between a power supply terminal of the Schmitt trigger inverter circuit and a first node between the source of the N-channel transistor in the CMOS inverter and the drain of the second transistor,
the first current limiting element is a depletion-mode transistor with a gate and the source connected to each other,
each of the first transistor, the second transistor, and the depletion-mode transistor is an N-channel transistor,
a drain of the first transistor is connected to the power supply terminal, and
the gate and the source of the depletion-mode transistor are connected to the first node.

12. The Schmitt trigger inverter circuit according to claim 11, further comprising:
a third transistor having a gate connected to the output of the CMOS inverter;

a second current limiting element connected to the third transistor in series; and a fourth transistor having a gate connected to the input of the Schmitt trigger inverter circuit, a source connected to the power supply terminal of the Schmitt trigger inverter circuit, and a drain connected to a source of a P-channel transistor in the CMOS inverter, wherein a second series circuit of the third transistor and the second current limiting element are connected between the reference potential of the Schmitt trigger inverter circuit and a second node between the source of the P-channel transistor in the CMOS inverter and the drain of the fourth transistor.

13. The Schmitt trigger inverter circuit according to claim 12, wherein the second current limiting element is a depletion-mode transistor with a gate and a source connected to each other, the second current limiting element is an N-channel transistor, and the third transistor is a P-channel transistor.

14. The Schmitt trigger inverter circuit according to claim 13, wherein the source and the gate of the second current limiting element are connected to the reference potential, a drain of the second current limiting element is connected to a drain of the third transistor, and a source of the third transistor is connected to the second node.

15. The Schmitt trigger inverter circuit according to claim 13, wherein the source and the gate of the second current limiting element are connected to a source of the third transistor, a drain of the second current limiting element is connected to the second node, and a drain of the third transistor is connected to the reference potential.

16. A Schmitt trigger inverter circuit, comprising:

a CMOS inverter having an input and output connected to an input and output of the Schmitt trigger inverter circuit, respectively;

a first transistor having a gate connected to the output of the CMOS inverter;

a first current limiting element connected to the first transistor in series, the first current limiting element having a source connected to a power supply terminal of the Schmitt trigger inverter circuit and a drain connected to a drain of the first transistor; and a second transistor having a gate connected to the input of the Schmitt trigger inverter circuit, a drain connected to a source of an N-channel transistor in the CMOS inverter, and a source connected to a reference potential of the Schmitt trigger inverter circuit, wherein a first series circuit of the first transistor and the first current limiting element are connected between the power supply terminal of the Schmitt trigger inverter circuit and a first node between the source of the N-channel transistor in the CMOS inverter and the drain of the second transistor, the first current limiting element is a depletion-mode transistor with a gate and the source connected to each other, each of the first transistor and the second transistor is an N-channel transistor, the depletion-mode transistor is a P-channel transistor, the source of the depletion-mode transistor is connected to the power supply terminal, and the source of the first transistor is connected to the drain of the second transistor.

17. The Schmitt trigger inverter circuit according to claim 16, further comprising:

a third transistor having a gate connected to the output of the CMOS inverter;

a second current limiting element connected to the third transistor in series; and a fourth transistor having a gate connected to the input of the Schmitt trigger inverter circuit, a source connected to the power supply terminal of the Schmitt trigger inverter circuit, and a drain connected to a source of a P-channel transistor in the CMOS inverter, wherein a second series circuit of the third transistor and the second current limiting element are connected between the reference potential of the Schmitt trigger inverter circuit and a second node between the source of the P-channel transistor in the CMOS inverter and the drain of the fourth transistor.

18. The Schmitt trigger inverter circuit according to claim 17, wherein the second current limiting element is a depletion-mode transistor with a gate and a source connected to each other, the second current limiting element is an P-channel transistor, and the third transistor is a P-channel transistor.

19. The Schmitt trigger inverter circuit according to claim 18, wherein the source and the gate of the second current limiting element are connected to a drain of the third transistor, a drain of the second current limiting element is connected to the reference potential, and a source of the third transistor is connected to the second node.

20. The Schmitt trigger inverter circuit according to claim 18, wherein the source and the gate of the second current limiting element are connected to the second node, a drain of the second current limiting element is connected to a source of the third transistor, and a drain of the third transistor is connected to the reference potential.

21. A Schmitt trigger inverter circuit, comprising:

a CMOS inverter having an input and output connected to an input and output of the Schmitt trigger inverter circuit, respectively;

a first transistor having a gate connected to the output of the CMOS inverter;

a first current limiting element connected to the first transistor in series, the first current limiting element having a source connected to a source of the first transistor; and a second transistor having a gate connected to the input of the Schmitt trigger inverter circuit, a drain connected to a source of an N-channel transistor in the CMOS inverter, and a source connected to a reference potential of the Schmitt trigger inverter circuit, wherein a first series circuit of the first transistor and the first current limiting element are connected between a power supply terminal of the Schmitt trigger inverter circuit and a first node between the source of the N-channel transistor in the CMOS inverter and the drain of the second transistor, the first current limiting element is a depletion-mode transistor with a gate and the source connected to each other, each of the first transistor and the second transistor is an N-channel transistor, the depletion-mode transistor is a P-channel transistor, a drain of the first current limiting element is connected to the first node, and a drain of the first transistor is connected to the power supply terminal.

22. The Schmitt trigger inverter circuit according to claim 21, further comprising:

a third transistor having a gate connected to the output of the CMOS inverter;

a second current limiting element connected to the third transistor in series; and a fourth transistor having a gate connected to the input of the Schmitt trigger inverter circuit, a source connected to the power supply terminal of the Schmitt trigger inverter circuit, and a drain connected to a source of a P-channel transistor in the CMOS inverter, wherein a second series circuit of the third transistor and the second current limiting element are connected between the reference potential of the Schmitt trigger inverter circuit and a second node between the source of the P-channel transistor in the CMOS inverter and the drain of the fourth transistor.

23. The Schmitt trigger inverter circuit according to claim 22, wherein the second current limiting element is a depletion-mode transistor with a gate and a source connected to each other, the second current limiting element is an P-channel transistor, and the third transistor is a P-channel transistor.

24. The Schmitt trigger inverter circuit according to claim 23, wherein the source and the gate of the second current limiting element are connected to a drain of the third transistor, a drain of the second current limiting element is connected to the reference potential, and a source of the third transistor is connected to the second node.

25. The Schmitt trigger inverter circuit according to claim 23, wherein the source and the gate of the second current limiting element are connected to the second node, a drain of the second current limiting element is connected to a source of the third transistor, and a drain of the third transistor is connected to the reference potential.

26. A Schmitt trigger inverter circuit, comprising:

a CMOS inverter having an input and output connected to an input and output of the Schmitt trigger inverter circuit, respectively;

a first transistor having a gate connected to the output of the CMOS inverter;

a first current limiting element connected to the first transistor in series, the first current limiting element having a source connected to a source of the first transistor; and a second transistor having a gate connected to the input of the Schmitt trigger inverter circuit, a drain connected to a source of an P-channel transistor in the CMOS inverter, and a source connected to a power supply terminal of the Schmitt trigger inverter circuit, wherein a first series circuit of the first transistor and the first current limiting element are connected between a reference potential of the Schmitt trigger inverter circuit and a first node between the source of the P-channel transistor in the CMOS inverter and the drain of the second transistor, the first current limiting element is a depletion-mode transistor with a gate and the source connected to each other, each of the first transistor and the second transistor is a P-channel transistor, the depletion-mode transistor is an N-channel transistor, a drain of the first transistor is connected to the reference potential, and the drain of the depletion-mode transistor is connected to the first node.

27. The Schmitt trigger inverter circuit according to claim 26, further comprising:

a third transistor having a gate connected to the output of the CMOS inverter;

a second current limiting element connected to the third transistor in series; and a fourth transistor having a gate connected to the input of the Schmitt trigger inverter circuit, a source connected to the reference potential of the Schmitt trigger inverter circuit, and a drain connected to a source of a N-channel transistor in the CMOS inverter, wherein a second series circuit of the third transistor and the second current limiting element are connected between the power supply terminal of the Schmitt trigger inverter circuit and a second node between the source of the N-channel transistor in the CMOS inverter and the drain of the fourth transistor.

28. The Schmitt trigger inverter circuit according to claim 27, wherein the second current limiting element is a depletion-mode transistor with a gate and a source connected to each other, the second current limiting element is an N-channel transistor, and the third transistor is a N-channel transistor.

29. The Schmitt trigger inverter circuit according to claim 28, wherein a drain of the second current limiting element is connected to the power supply terminal, the source and the gate of the second current limiting element are connected to a drain of the third transistor, and a source of the third transistor is connected to the second node.

30. The Schmitt trigger inverter circuit according to claim 28, wherein a drain of the second current limiting element is connected to a source of the third transistor, the source and the gate of the second current limiting element are connected to the second node, and a drain of the third transistor is connected to the power supply terminal.

31. A Schmitt trigger inverter circuit, comprising:

a CMOS inverter having an input and output connected to an input and output of the Schmitt trigger inverter circuit, respectively;

a first transistor having a gate connected to the output of the CMOS inverter;

a first current limiting element connected to the first transistor in series, the first current limiting element having a drain connected to a reference potential of the Schmitt trigger inverter circuit and a source connected to a drain of the first transistor; and a second transistor having a gate connected to the input of the Schmitt trigger inverter circuit, a drain connected to a source of an P-channel transistor in the CMOS inverter, and a source connected to a power supply terminal of the Schmitt trigger inverter circuit, wherein a first series circuit of the first transistor and the first current limiting element are connected between the reference potential of the Schmitt trigger inverter circuit and a first node between the source of the P-channel transistor in the CMOS inverter and the drain of the second transistor, the first current limiting element is a depletion-mode transistor with a gate and the source connected to each other, each of the first transistor, the second transistor, and the depletion-mode transistor is a P-channel transistor, the drain of the depletion-mode transistor is connected to the reference potential, and the source of the first transistor is connected to the drain of the second transistor.

32. The Schmitt trigger inverter circuit according to claim 31, further comprising:

a third transistor having a gate connected to the output of the CMOS inverter;

a second current limiting element connected to the third transistor in series; and a fourth transistor having a gate connected to the input of the Schmitt trigger inverter circuit, a source connected to the reference potential of the Schmitt trigger inverter circuit, and a drain connected to a source of a N-channel transistor in the CMOS inverter, wherein a second series circuit of the third transistor and the second current limiting element are connected between the power supply terminal of the Schmitt trigger inverter circuit and a second node between the source of the N-channel transistor in the CMOS inverter and the drain of the fourth transistor.

33. The Schmitt trigger inverter circuit according to claim 32, wherein the second current limiting element is a depletion-mode transistor with a gate and a source connected to each other, the second current limiting element is an P-channel transistor, and the third transistor is a N-channel transistor.

34. The Schmitt trigger inverter circuit according to claim 33, wherein a drain of the second current limiting element is connected to a drain of the third transistor, the source and the gate of the second current limiting element are connected to the power supply terminal, and a source of the third transistor is connected to the second node.

35. The Schmitt trigger inverter circuit according to claim 33, wherein a drain of the second current limiting element is connected to the second node, the source and the gate of the second current limiting element are connected to a source of the third transistor, and a drain of the third transistor is connected to the power supply terminal.

36. A Schmitt trigger inverter circuit, comprising:

a CMOS inverter having an input and output connected to an input and output of the Schmitt trigger inverter circuit, respectively;

a first transistor having a gate connected to the output of the CMOS inverter;

a first current limiting element connected to the first transistor in series, the first current limiting element having a drain connected to a source of the first transistor; and a second transistor having a gate connected to the input of the Schmitt trigger inverter circuit, a drain connected to a source of an P-channel transistor in the CMOS inverter, and a source connected to a power supply terminal of the Schmitt trigger inverter circuit, wherein a first series circuit of the first transistor and the first current limiting element are connected between a reference potential of the Schmitt trigger inverter circuit and a first node between the source of the P-channel transistor in the CMOS inverter and the drain of the second transistor, the first current limiting element is a depletion-mode transistor with a gate and the source connected to each other, each of the first transistor, the second transistor, and the depletion-mode transistor is a P-channel transistor, a source of the first current limiting element is connected to the first node, and a drain of the first transistor is connected to the reference potential.

37. The Schmitt trigger inverter circuit according to claim 36, further comprising:

a third transistor having a gate connected to the output of the CMOS inverter;

a second current limiting element connected to the third transistor in series; and a fourth transistor having a gate connected to the input of the Schmitt trigger inverter circuit, a source connected to the reference potential of the Schmitt trigger inverter circuit, and a drain connected to a source of a N-channel transistor in the CMOS inverter, wherein a second series circuit of the third transistor and the second current limiting element are connected between the power supply terminal of the Schmitt trigger inverter circuit and a second node between the source of the N-channel transistor in the CMOS inverter and the drain of the fourth transistor.

38. The Schmitt trigger inverter circuit according to claim 37, wherein the second current limiting element is a depletion-mode transistor with a gate and a source connected to each other, the second current limiting element is an P-channel transistor, and the third transistor is a N-channel transistor.

39. The Schmitt trigger inverter circuit according to claim 38, wherein a drain of the second current limiting element is connected to a drain of the third transistor, the source and the gate of the second current limiting element are connected to the power supply terminal, and a source of the third transistor is connected to the second node.

40. The Schmitt trigger inverter circuit according to claim 38, wherein a drain of the second current limiting element is connected to the second node,
the source and the gate of the second current limiting element are connected to a source of the third transistor, and
a drain of the third transistor is connected to the power supply terminal.

\* \* \* \* \*